US006573576B2

(12) United States Patent
Park et al.

(10) Patent No.: US 6,573,576 B2
(45) Date of Patent: Jun. 3, 2003

(54) SEMICONDUCTOR DEVICE AND METHOD FOR FABRICATING THE SAME

(75) Inventors: Young June Park, Seoul (KR); Jong Ho Lee, Kyungki-do (KR); Hyeok Jae Lee, Kyungki-do (KR)

(73) Assignee: Hyundai Electronics Industries Co., Ltd., Kyoungki-Do (KR)

( * ) Notice: Subject to any disclaimer, the term of this patent is extended or adjusted under 35 U.S.C. 154(b) by 0 days.

(21) Appl. No.: 09/944,151

(22) Filed: Sep. 4, 2001

(65) Prior Publication Data

US 2002/0037620 A1 Mar. 28, 2002

Related U.S. Application Data

(62) Division of application No. 09/306,915, filed on May 7, 1999, now Pat. No. 6,303,441.

(30) Foreign Application Priority Data

May 14, 1998 (KR) ......................... 1998/17403

(51) Int. Cl.[7] .................. H01L 29/76; H01L 29/94; H01L 21/336
(52) U.S. Cl. .................. 257/396; 257/333; 257/389; 438/270
(58) Field of Search .................. 438/270, 154, 438/155, 222, 226, 275, 289, 443, 444, 589; 257/347–349, 333, 396, 389

(56) References Cited

U.S. PATENT DOCUMENTS

| 4,062,699 A | 12/1977 | Armstrong | 438/289 |
| 4,145,233 A | 3/1979 | Sefick et al. | 438/289 |
| 4,950,616 A | 8/1990 | Kahng et al. | 438/226 |
| 5,108,937 A | 4/1992 | Tsai et al. | 438/282 |
| 5,489,792 A | * 2/1996 | Hu et al. | 257/347 |
| 5,811,336 A | 9/1998 | Kasai | 438/589 |
| 5,814,544 A | 9/1998 | Huang | 438/298 |

OTHER PUBLICATIONS

Vincent M.C. Chen et al. "A New Approach to Implement 0.1 μm MOSFET on Thin–Film SOI Substrate with Self–Aligned Source–Body Contact" 1994 IEEE, IEDM 94, pp. 657–660.
Masatada Horiuchi et al. "BESS: A Source Structure that Fully Suppresses the Floating Body Effects in SOI COMOS–FETs" 1996 IEEE, IEDM 96, pp. 121–124.
Eric P. Ver Ploeg et al. "Elimination of Bipolar–Induced Breakdown in Fully–Depleted SOI MOSFETs" 1992 IEEE, IEDM 92, pp. 337–340.
W. Chen et al. "Suppression of the SOI Floating–body Effects by Linked–body Device Structure" 1996 IEEE, 1996 Symposium on VLSI Technology Digest of Technical Papers pp. 92–93.

* cited by examiner

Primary Examiner—Matthew Smith
Assistant Examiner—Calvin Lee
(74) Attorney, Agent, or Firm—Fleshner & Kim, LLP

(57) ABSTRACT

A semiconductor device and a method for fabricating the same is disclosed, which minimizes device degradation, minimizes noises, and simplifies the fabrication process. The device includes a substrate having a first semiconductor layer, a buried insulating film, and a second semiconductor layer stacked; a field oxide film for separating the second semiconductor layer into a first region and a second region; a recess region formed in a particular region of the second region; gate insulating films and gate electrodes formed in stacks on each of a particular region in the first region and the recess region in the second region; first impurity regions formed in surfaces of the second semiconductor layer on both sides of the gate electrode in the first region; and second impurity regions formed in surfaces of the second semiconductor layer on both sides of the gate electrode in the recess region in the second region so that the second semiconductor layer below the gate electrode is fully depleted.

23 Claims, 7 Drawing Sheets

SEMICONDUCTOR DEVICE AND METHOD FOR FABRICATING THE SAME

This application is a Divisional of Application No. 09/306,915 filed May 7, 1999 issued U.S. Pat. No. 6,303,441.

BACKGROUND OF THE INVENTION

1. Field of the Invention

The present invention relates to a semiconductor device, and more particularly, to an analog and/or a digital circuit and a method for fabricating the same.

2. Background of the Related Art

Related art semiconductor devices will be explained with reference to the attached drawings. Recent developments in silicon processing and integrated circuit technologies require circuits which operate on lower power and voltage at a fast speed. However, when bulk silicon is used to fabricate such circuits, the benefits are limited due to short channel effects and large junction capacitance.

Such problems can be solved by using a SOI substrate. A device fabricated using the SOI, however, has problems, including a Kirk effect from floating body effect, and a low breakdown voltage due to a parasitic bipolar transistor. The floating body effect affects analog circuits more seriously than it does digital circuits. In an effort to solve these problems, different SOI related art methods have been used where a source region structure is changed, or where a field oxide film formed on the SOI is made thinner.

Referring to FIG. 1, a semiconductor device fabricated according to the first related art method is provided with an SOI substrate having a first semiconductor layer 1, a buried oxide film 2, and a second semiconductor layer 3 formed in succession. The second semiconductor layer 3 has a thickness of approximately 1500 Å. A gate oxide film 4 and a gate electrode 5 are stacked on a particular region of the second semiconductor layer 3, and a source region 7a and a drain region 7b are formed in the second semiconductor layer 3 on both sides of the gate electrode 5 in contact with the buried oxide film 2.

The second semiconductor layer 3 is doped with P type ions, and the gate electrode 5 and the source region 7a and the drain region 7b are heavily doped with N type ions. A surface of the second semiconductor layer 3 under the gate electrode 5 is heavily doped to form a N type impurity region 6 in contact with the source region 7a. In order to solve the problem of the floating body effect, a heavily doped P type ($p^+$) impurity region 8 is formed so as to contact both a bottom of the heavily doped N type impurity region 6 and the source region 7a.

In other words, by causing a tunneling between the source region 7a and the heavily doped P type ($p^+$) impurity region 8, the channel bias is set such that the source region 7a and the heavily doped P type ($p^+$) impurity region 8 operate like a zener diode.

Referring to FIG. 2, a semiconductor device fabricated according to the second related art method has a parasitic bipolar transistor under a source region to set a body bias. The device includes a SOI substrate having a first semiconductor layer 1, a buried oxide film 2, and a second semiconductor layer 3 formed in succession. A gate oxide film 4 and a gate electrode 5 are formed on a particular portion of the second semiconductor layer 3, and a source region 7a heavily doped with N type ions is formed in a surface of the semiconductor layer 3 on one side of the gate electrode 5. A drain region (not shown), which is also heavily doped with N type ions, is formed on the other side of the gate electrode 5 in contact with the buried oxide film 2. The second semiconductor layer 3 is lightly doped with P type ions ($p^-$), and a portion of the second semiconductor layer 3 under a central portion of the source region 7a and in contact with the buried oxide film 2 is lightly doped with N type ions ($n^-$). Accordingly, a pnp parasitic bipolar transistor is formed under the source region 7a. A body bias can be set using the parasitic bipolar transistor.

Referring to FIG. 3, a semiconductor device fabricated according to the third related art method, in which a body bias is set by forming metal spikings in a source region, has a SOI substrate including a first semiconductor layer 1, a buried oxide film 2, and a second semiconductor layer 3 formed in succession. A gate oxide film 4 and a gate electrode 5 are stacked on a particular region, and portions of the second semiconductor layer 3 on both sides of the gate electrode 5 are heavily doped with N type ions to form a source region 7a and a drain region 7b. The second semiconductor layer 3 is then lightly doped with P type ions ($p^-$), and he source region 7a and the drain region 7b are heavily doped with N type ions ($n^+$). The source region 7a and the drain region 7b are both in contact with the buried oxide film 2. A heavily doped P type impurity region 8 is formed in the second semiconductor layer under the source region 7a. A protection film 10 includes contact holes to expose particular portions of the source region 7a and the drain region 7b. The contact holes are filled with aluminum interconnection layers 11. The aluminum interconnection layers 11 have irregular aluminum spikings extending into the source region 7a and the drain region 7b.

FIG. 4 shows two perspectives of a semiconductor device fabricated according to the fourth related art method. The left portion illustrates a section of the device in a channel width direction, and the right portion illustrates the device in a channel length direction. The device includes a first semiconductor layer 1 having a buried oxide film 2 formed thereon, a lightly doped P type second semiconductor layer 3 formed on the buried oxide film 2, with an active region and a filed region defined on the second semiconductor layer 3. It further includes a field oxide film 12 formed in and on a surface of the second semiconductor layer 3 defined as the field region. There is also a thin, lightly doped P type second semiconductor layer 3 under the field oxide film 12, and a gate oxide film 4 and a gate electrode 5 formed on a particular portion of the second semiconductor layer 3. Further, there are heavily doped source and drain regions 7a and 7b in the second semiconductor layer 3 on either side of the gate electrode 5. The source region 7a and the drain region 7b are in contact with the buried oxide film 2.

The aforementioned related art semiconductor devices have various problems. For example, the possibility that a body voltage will be applied only to the source region in the first, second, and third related art methods, allowing application only to a pass transistor, provides less flexibility in construction of a circuit. The first, second, and third related art methods require a separate process to set a body voltage. Further, the high possibility that latch up will occur in the fourth related art device reduces its reliability. Moreover, a digital circuit with a semiconductor device formed according to the fourth related art method does not take full advantage of the benefits of the SOI because a partial depletion type and a full depletion type are not coexistent.

The above references are incorporated by reference herein where appropriate for appropriate teachings of additional or alternative details, features and/or technical background.

SUMMARY OF THE INVENTION

The present invention is directed to a semiconductor device and a method for fabricating the same that substantially obviates one or more of the problems due to limitations and disadvantages of the related art.

An object of the present invention is to substantially eliminate a degradation of the semiconductor device.

Another object or the present invention is to minimize noise.

Another object of the present invention is to simplify the fabrication process.

To achieve at least the above described objects, in whole or in parts, there is provided a semiconductor device that includes a substrate having a first semiconductor layer, a buried insulating film, and a second semiconductor layer, a field oxide film which separates the second semiconductor layer into a first region and a second region, a recess region formed in a prescribed region of the second region, gate insulating films and gate electrodes formed on each of a particular region in the first region and the recess region in the second region, first impurity regions formed in surfaces of the second semiconductor layer on both sides of the gate electrode in the first region, and second impurity regions formed in surfaces of the second semiconductor layer on both sides of the gate electrode in the recess region in the second region so that the second semiconductor layer below the gate electrode is fully depleted.

Also, to achieve at least the above-mentioned objects, in whole or in parts, there is provided a method for fabricating a semiconductor device according to the present invention that includes the steps of (1) preparing a substrate having a first semiconductor layer, a buried insulating film, and a second semiconductor layer, (2) forming a field insulating film to separate the second semiconductor layer into a first region and a second region, (3) forming a recess region on a particular portion of the second region, (4) forming first and second gate electrodes over a particular portion of the first region and the recess region, and (5) forming first impurity regions in surfaces of the second semiconductor layer on both sides of the first gate electrode at the same time as forming second impurity regions in surfaces of the second semiconductor layer on both sides of the second gate electrode so that the second semiconductor layer below the second gate electrode is fully depleted.

Also, to achieve at least the above objects in whole or in parts, there is provided a semiconductor device including a first semiconductor region formed on a substrate, and a second semiconductor region formed on the substrate, wherein the first semiconductor region includes an analog device and the second semiconductor region includes a digital device.

To further achieve at least the above-described objects in whole or in parts, there is further provided a semiconductor device, that includes a substrate having a recess region, a gate electrode formed on the substrate at a lower portion of the recess region, and impurity regions formed in surfaces of the substrate on both sides of the gate electrode, wherein the substrate includes a first semiconductor layer, a buried insulating film, and a second semiconductor layer.

Additional advantages, objects, and features of the invention will be set forth in part in the description which follows and in part will become apparent to those having ordinary skill in the art upon examination of the following or may be learned from practice of the invention. The objects and advantages of the invention may be realized and attained as particularly pointed out in the appended claims.

BRIEF DESCRIPTION OF THE DRAWINGS

The invention will be described in detail with reference to the following drawings in which like reference numerals refer to like elements wherein.

DETAILED DESCRIPTION OF PREFERRED EMBODIMENTS

Figure 1:
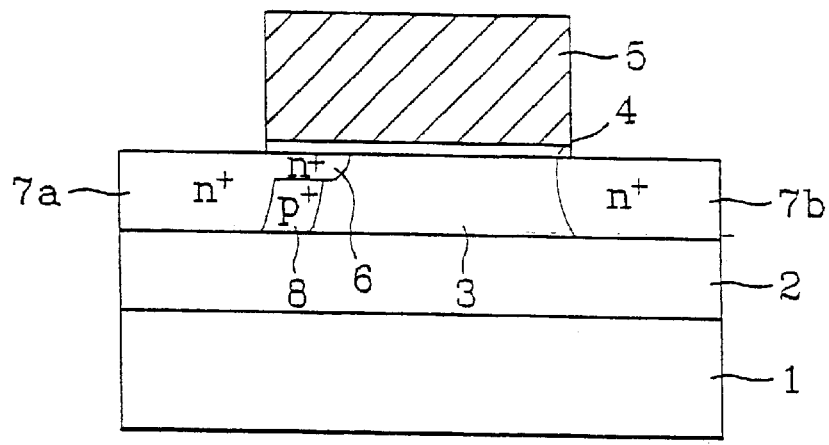
FIG. 1 is a diagram which illustrates a section of a semiconductor device setting a body bias by a first related art method using a zener diode.
Figure 2:
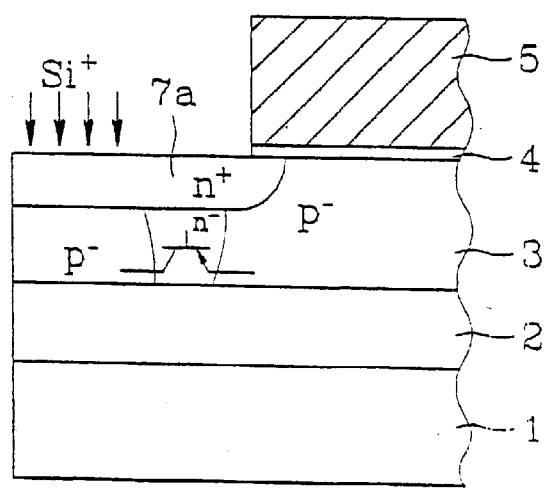
FIG. 2 is a diagram which illustrates a section of a semiconductor device setting a body bias by a second related art method using a parasitic bipolar.
Figure 3:
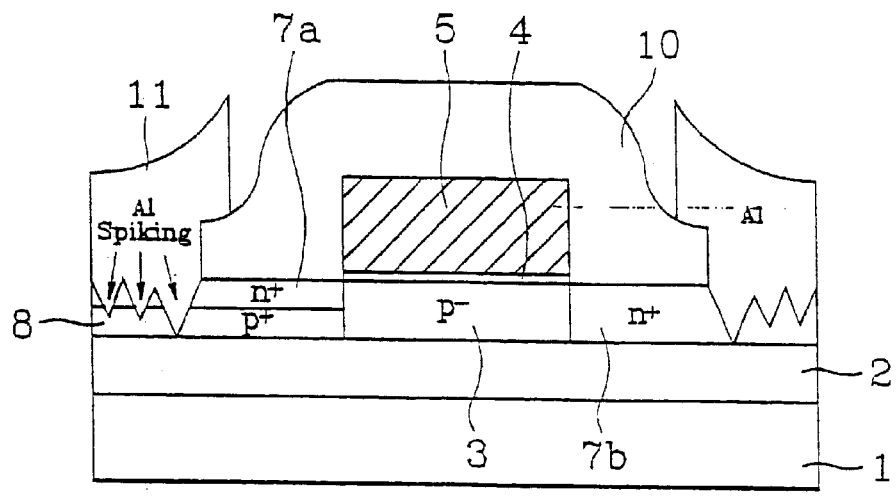
FIG. 3 is a diagram which illustrates a section of a semiconductor device setting a body bias by a third related art method using junction spikes.
Figure 4:
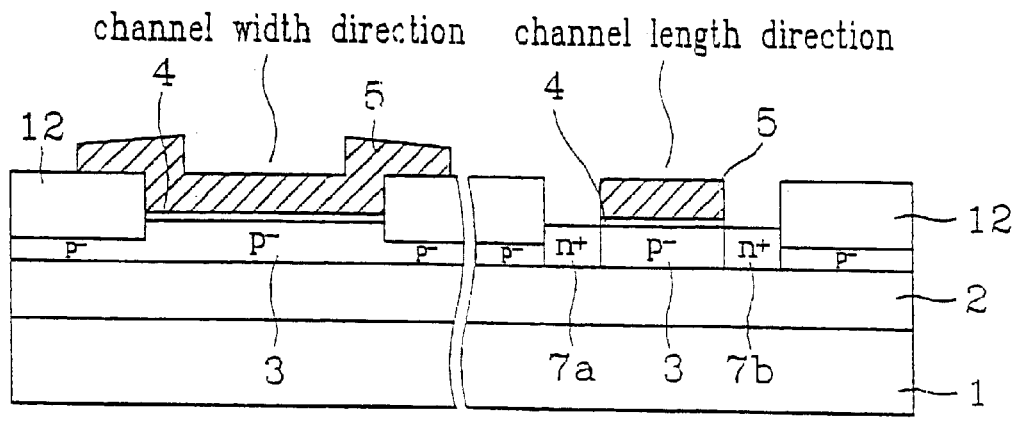
FIG. 4 is a diagram which illustrates a section of a semiconductor device of a fourth related art method.
Figure 5:
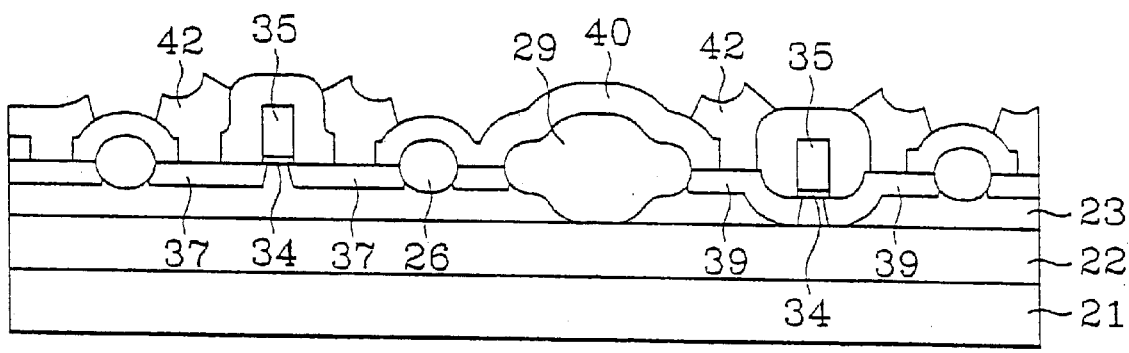
FIG. 5 is a diagram which illustrates a section of a semiconductor device according to a preferred embodiment of the present invention.

Referring to FIG. 5, the semiconductor device according to a preferred embodiment of the present invention includes a SOI substrate having a first semiconductor layer 21, a buried oxide film 22, and a second semiconductor layer 23. The device further includes a second field oxide film 29 in contact with the buried oxide film 22 so as to be isolated from the second semiconductor layer 23. A first side of the second field oxide film 29, the second semiconductor layer 23 is defined as an analog circuit fabrication region, and on a second side of the second field oxide film 29, the second semiconductor layer 23 is defined as a digital circuit fabrication region.

A plurality of first field oxide films 26 is formed on particular regions of the second semiconductor layer 23 on both sides of the second field oxide film 29. Further, a gate oxide film 34 and a gate electrode 35 are formed on a particular region of the second semiconductor layer 23 in the analog circuit fabrication region. A region of the semiconductor layer 23 formed on the first side of the second field oxide film 29 is doped with N type impurity ions, and first source/drain regions 37 are formed in surfaces of the second semiconductor layer 23 on both sides of the gate electrode 35.

Next, a recess region is formed in a region of the second semiconductor layer 23 on the second side of the second field oxide film 29, and a gate oxide film 34 and a gate electrode 35 are formed in a particular region of the recess region. A P type impurity region is formed in a particular region of the second semiconductor layer 23 on the second side of the second field oxide film 29, and second source/drain regions 39 are formed in the second semiconductor layer 23 on both sides of the gate electrode 35. The second source/drain regions 39 at lower portions of the recess region in the second semiconductor layer 23 on both sides of the gate electrode 35 are formed to be in contact with the buried oxide film 22, and remaining second source/drain regions 39 on both sides of the gate electrode 35 are formed in surfaces of the second semiconductor layer 23. In other words, the second semiconductor layer 23 at lower portions of the gate electrode 35, which is formed in the recess region, is isolated from the other second semiconductor layer 23 by means of the second source/drain regions 39 in contact with the buried oxide film 22, such that the second semiconductor layer 23 under the gate electrode 35 is fully depleted.

Each of the first and second source/drain regions 37 and 39 contains a LDD (Lightly Doped Drain) structure (not shown). There is an interlayer insulating film 40 having contact holes in the first and second source/drain regions 37 and 39, and regions in which the N type and the P type ions are injected. Further, there is a plurality of interconnection layers 42 in contact with the first and second source/drain regions 37 and 39 and regions in which the N type and the P type ions are injected.

Figure 6A:
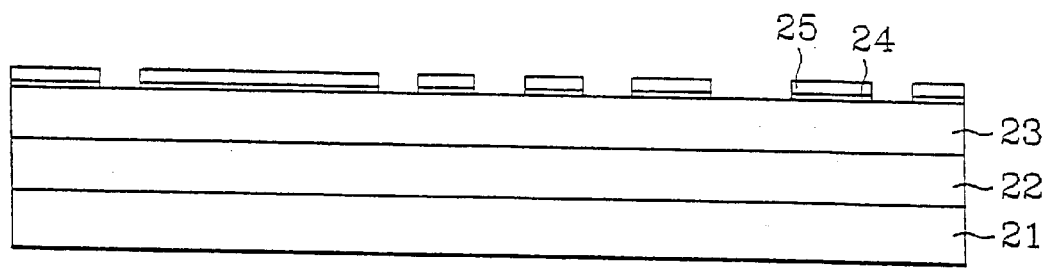
FIGS. 6a–6l are diagrams which illustrate sections showing the steps of a method for fabricating a semiconductor device according to a preferred embodiment of the present invention.

FIGS. 6a–6l illustrate sections showing the steps of a method for fabricating a semiconductor device in accordance with a preferred embodiment of the present invention. Referring to FIG. 6a, the method for fabricating a semiconductor device in accordance with a preferred embodiment of the present invention starts with forming a first buffer oxide film 24 and a first nitride film 25 on a second semiconductor layer 23 in a SOI semiconductor substrate having a first semiconductor layer 21, a buried oxide film 22, and a second semiconductor layer 23. Then, the first buffer oxide film 24 and the first nitride film 25 are selectively etched to expose a plurality of regions of the second semiconductor layer 23.

Figure 6B:
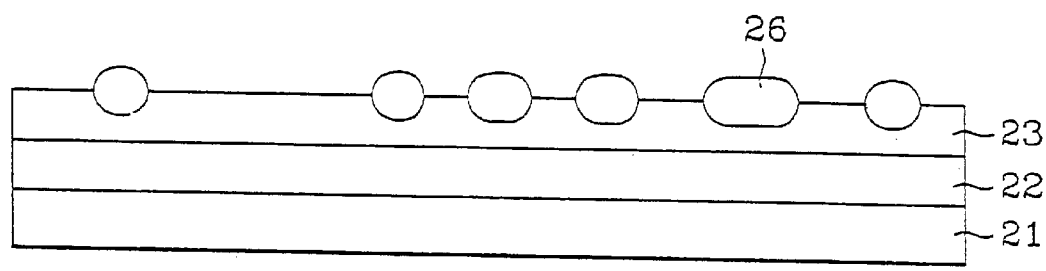
Figure 6C:
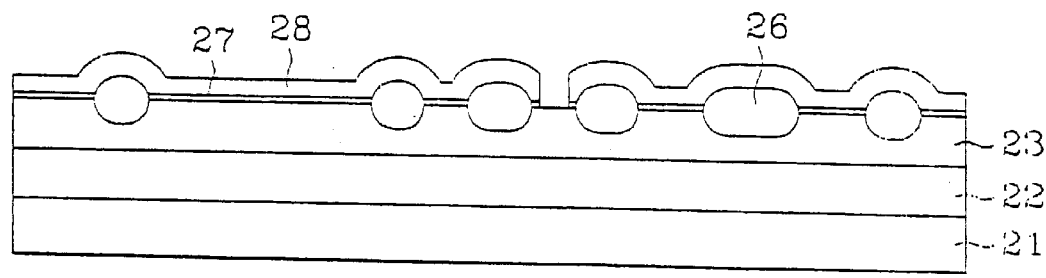

As shown in FIG. 6b, the etched first buffer oxide film 24 and the first nitride film 25 are used as a mask in conducting a thermal oxidation to form a plurality of first field oxide films 26. The first buffer oxide film 24 and the first nitride film 25 are then removed. Referring to FIG. 6c, a second buffer oxide film 27 and a second nitride film 28 are deposited on the entire surface and subjected to photo etching to expose the second semiconductor layer 23 between the first field oxide films 26.

Figure 6D:
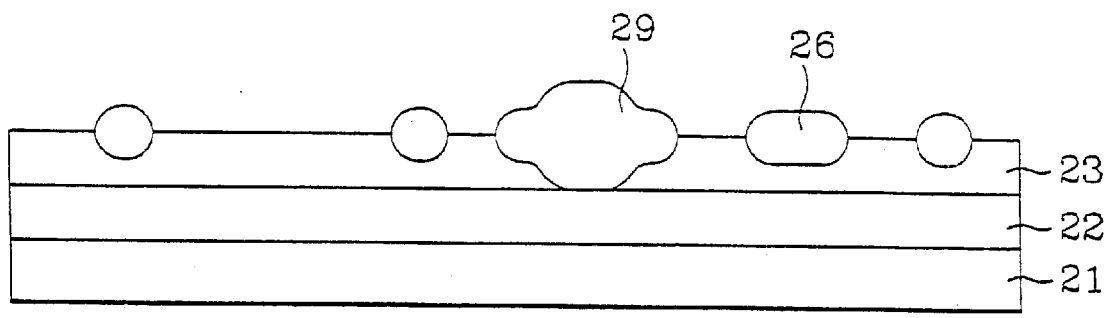

As shown in FIG. 6d, thermal oxidation is conducted to form a second field oxide film 29 in the exposed second semiconductor layer 23, connected to the first field oxide films 26 at both sides and in contact with the buried oxide film 22, which isolates the second semiconductor layer 23. Then, the second buffer oxide film 23 and the second nitride film 28 are removed. Next, an analog circuit is fabricated on one side of the second field oxide film 29 and a digital circuit is fabricated on the other side of the second field oxide film 29.

Figure 6E:
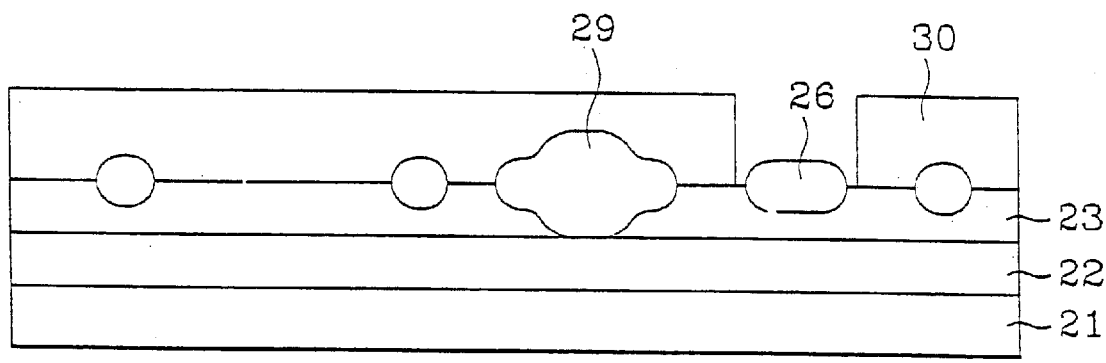
Figure 6F:
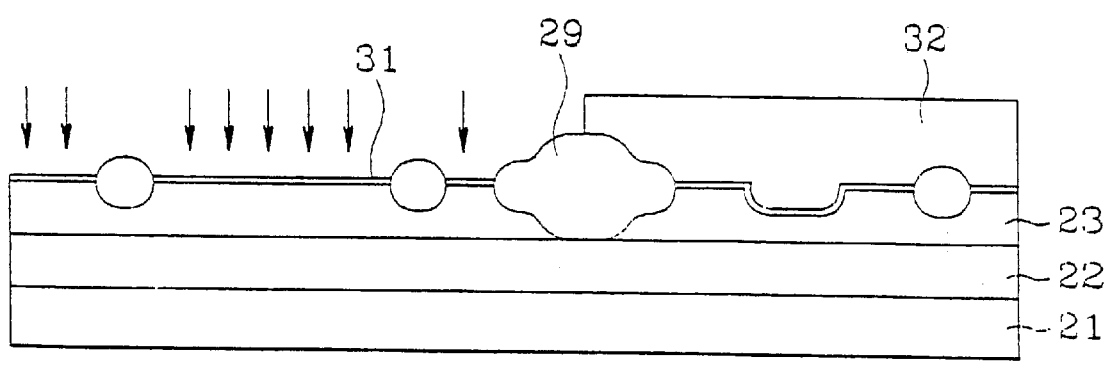

Referring to FIG. 6e, a first photoresist film 30 is coated on an entire surface and subjected to selective patterning by exposure and development to expose the first field oxide film 26 formed in the other side of the second field oxide film 29, i.e., the region for fabricating the digital circuit therein and the second semiconductor layer 23 adjacent to the first field oxide film 26. FIG. 6f shows a portion of the first field oxide film 26 which is exposed in the region for fabricating a digital circuit and then wet etched to expose the second semiconductor layer 23, to form a recess region.

The first photoresist film 30 is removed and a thin first oxide film 31 is formed on an entire surface. A second photoresist film 32 is coated on the entire surface and subjected to selective patterning by exposure and development to expose one side region of the second field oxide film 29 in which the analog circuit is to be fabricated. The patterned second photoresist film 32 is used as a mask to inject ions into a portion in which the analog circuit is to be fabricated, for adjusting a threshold voltage. In the case of a CMOS fabrication, ions for adjusting threshold voltages of an NMOS transistor and a PMOS transistor are injected, respectively.

Figure 6G:
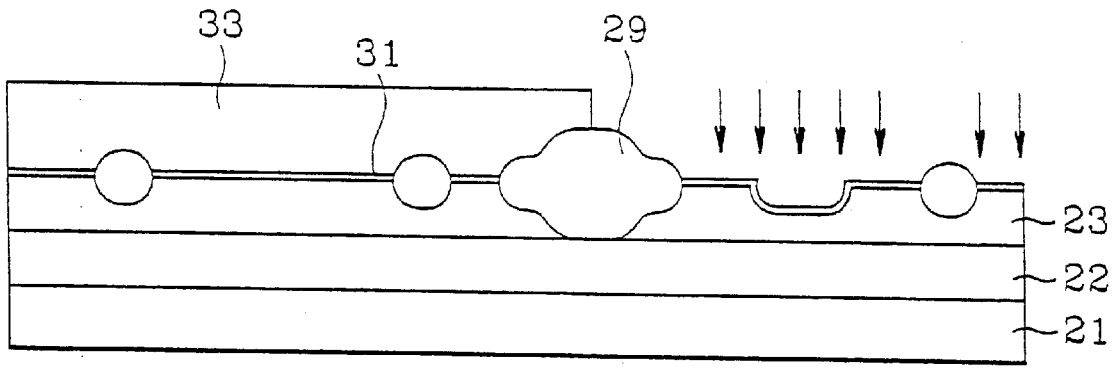

As shown in FIG. 6g, a third photoresist film 33 is coated on an entire surface and subjected to selective patterning by exposure and development to expose the other side region of the second field oxide film 29 in which the digital circuit is to be fabricated. The patterned third photoresist film 33 is used as a mask to inject ions into the exposed second semiconductor layer 23, for adjusting a threshold voltage. In the case of a CMOS fabrication, ions for adjusting threshold voltages of an NMOS transistor and a PMOS transistor are injected, respectively. Then, the third photoresist film 33 is removed.

Figure 6H:
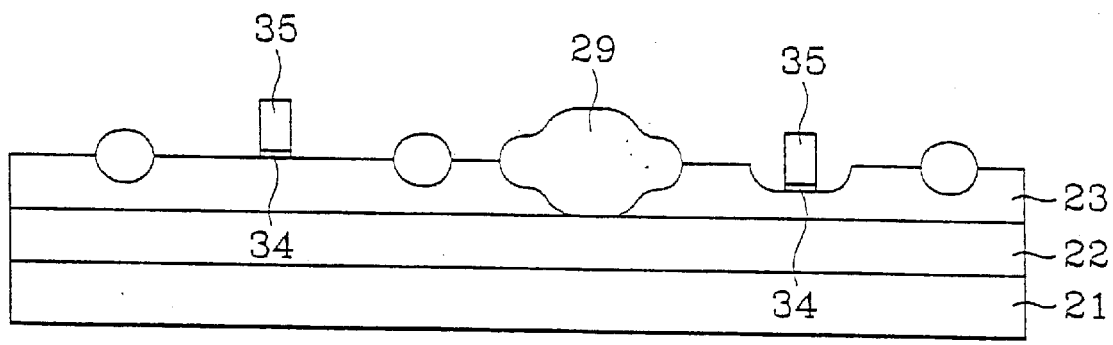

As shown in FIG. 6h, the first oxide film 31 is removed, and a gate oxide film 34 is formed on the entire surface by thermal oxidation or chemical vapor deposition. Then, a polysilicon layer is deposited on the entire surface and subjected to anisotropic etching using a gate formation mask, to form gate electrodes 35 in the analog circuit fabrication region and the digital circuit fabrication region, respectively. In this instance, the gate electrode 35 in the digital circuit fabrication region is formed in the recess region.

Figure 6I:
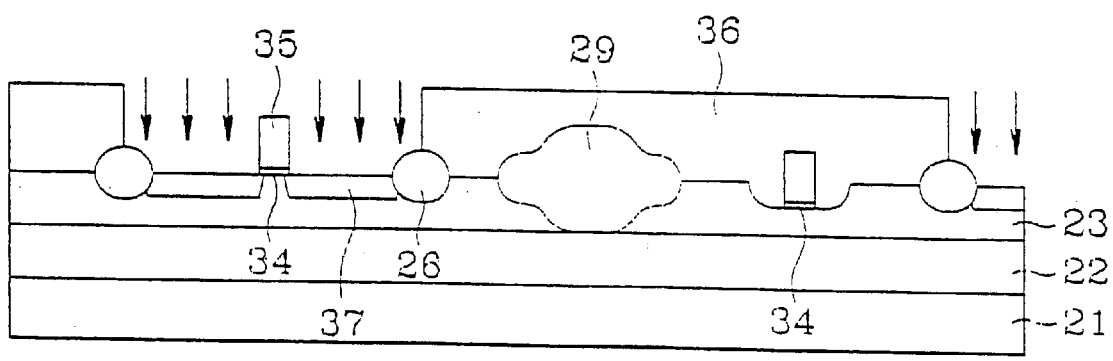

As shown in FIG. 6i, a fourth photoresist film 36 is coated on the entire surface and subjected to selective patterning by exposure and development to expose particular regions in the analog circuit fabrication region and the digital circuit fabrication region. The patterned fourth photoresist film 36 and the gate electrode 35 are used as a mask to heavily inject N type ions into surfaces of the exposed second semiconductor layer 23 to form first source/drain regions 37 in surfaces of the second semiconductor layer 23 on both sides of the gate electrode 35 in the analog circuit fabrication region. The fourth photoresist film 36 is then removed.

Figure 6J:
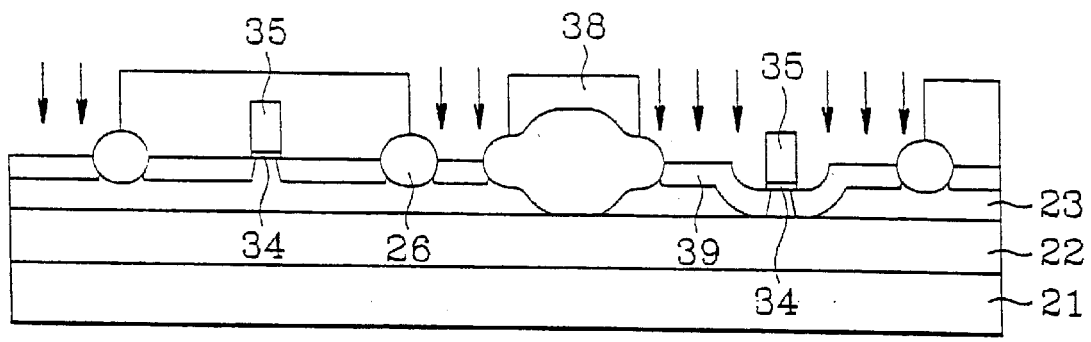

As shown in FIG. 6j, a fifth photoresist film 38 is coated and subjected to selective patterning by exposure and development to expose particular regions of the digital circuit fabrication region and the analog circuit fabrication region. The patterned fifth photoresist film 38 and the gate electrode 35 are used as a mask to heavily inject P type ions into the exposed second semiconductor layer 23. In this instance, second source/drain regions 39 are formed in the second semiconductor layer 23 on both sides of the gate electrode 35 in the digital circuit fabrication region, and the second source/drain regions 39 in the recess region are in contact with the buried oxide film 22, to form a full depletion region under the gate electrode 35.

Figure 6K:
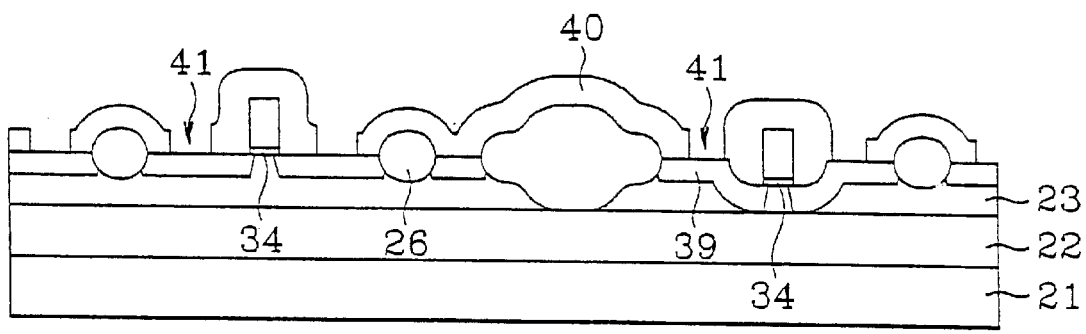
Figure 6L:
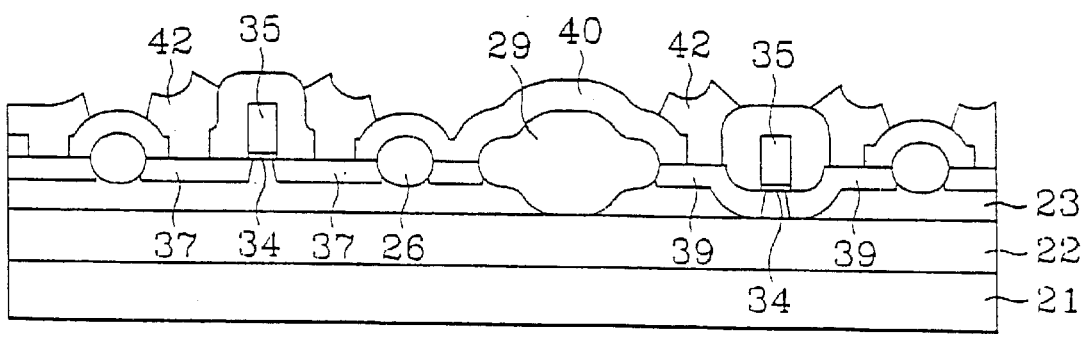

As shown in FIG. 6k, the fifth photoresist film 38 is removed, an interlayer insulating film 40 is deposited, and contact holes 41 are formed to expose the first and second source/drain regions 37 and 39, and regions into which the N and P type ions are injected. Next, as shown in FIG. 6l, a metal layer of aluminum or tungsten for forming interconnections is deposited on the entire surface and subjected to anisotropic etching, to form an interconnection layer 42 in each contact hole 41.

The aforementioned semiconductor device and the method for fabricating the same of the present invention has various advantages. For example, the full depletion type SOI device formed in the channel region of a transistor in the digital circuit fabrication region reduces degradation of the semiconductor device. Further, the simultaneous fabrication of the digital circuit and the analog circuit simplifies a fabrication process.

It will be apparent to those skilled in the art that various modifications and variations can be made in the semiconductor device and the method for fabricating the same of the present invention without departing from the spirit or scope of the invention. Thus, it is intended that the present invention cover the modifications and variations of this invention provided they come within the scope of the appended claims and their equivalents.

The foregoing embodiments are merely exemplary and are not to be construed as limiting the present invention. The present teaching can be readily applied to other types of apparatuses. The description of the present invention is intended to be illustrative, and not to limit the scope of the claims. Many alternatives, modifications, and variations will be apparent to those skilled in the art. In the claims, means-plus-function clauses are intended to cover the structures described herein as performing the recited function and not only structural equivalents but also equivalent structures.

What is claimed is:

1. A semiconductor device comprising:
   a substrate comprising a buried insulating film formed under a first semiconductor layer;
   a field insulating film formed in the substrate, wherein the field insulating film separates said substrate into a first region and a second region, and wherein the field insulating film extends through the first semiconductor layer to be in contact with the buried insulating film;
   a recess region formed in a prescribed region of the second region;
   a plurality of gate insulating films and gate electrodes formed on each of a prescribed region in said first region and said recess region in the second region;
   first impurity regions formed in surfaces of said substrate on both sides of said gate electrodes in the first region; and
   second impurity regions formed in surfaces of said substrate on both sides of said gate electrodes in said recess region in the second region.

2. The semiconductor device of claim 1, wherein said first region comprises an analog circuit device and said second region includes a digital device, and wherein said buried insulating film is under the recess region in the second region.

3. The semiconductor device of claim 1, wherein said substrate includes a second semiconductor layer located under the buried insulating film.

4. The semiconductor device of claim 3, wherein said second impurity regions formed on both sides of said gate electrodes at lower portions of said recess region among said second impurity regions in the second region are formed in the first semiconductor layer located above and in contact with upper portions of the buried insulating film.

5. The semiconductor device of claim 1, wherein each of said first and second impurity regions includes a LDD region.

6. The semiconductor device of claim 1, wherein said first and second impurity regions are differently doped regions.

7. The semiconductor device of claim 6, wherein said first impurity regions are n-type regions and said second impurity regions are p-type regions.

8. The semiconductor device of claim 1, wherein said substrate below the gate electrode is fully depleted, and wherein said buried insulating film and said second semiconductor layer continuously extend throughout the first and second regions.

9. The semiconductor device of claim 1, wherein the at least one of said plurality of gate insulating films is formed on the first semiconductor layer.

10. The semiconductor device, comprising:
    a substrate comprising a buried insulating film formed under a first semiconductor layer;
    a field insulating film formed in the substrate, wherein the field insulating film separates said substrate into a first region and a second region, and wherein the field insulating film extends through the first semiconductor layer to be in contact with the buried insulating film wherein said first region includes an analog device and said second region includes a digital device.

11. The semiconductor device of claim 10, further comprising impurity regions in said first semiconductor layer located above and in contact with said buried insulating film.

12. The semiconductor device of claim 10, wherein the digital device comprises:
    a recess region formed in the substrate;
    a gate electrode formed at a lower portion of said recess region;
    a gate insulating layer under the gate electrode on the first semiconductor layer; and
    impurity regions formed in surfaces of the substrate on both sides of said gate electrode.

13. The semiconductor device of claim 12, wherein said impurity regions are p-type regions.

14. The semiconductor device of claim 12, wherein said buried insulating film is under the recess region.

15. The semiconductor device of claim 12, wherein said substrate below the gate electrode is fully depleted.

16. The semiconductor device of claim 10, wherein a portion of the substrate of said first semiconductor region includes a partial depletion region and a portion of said second semiconductor region includes a full depletion region.

17. The semiconductor device of claim 16, wherein the substrate further comprises a second semiconductor layer located under the buried insulating film.

18. The semiconductor device of claim 17, wherein the analog device comprises:
    a gate electrode formed on the substrate; and
    impurity regions formed in surfaces of the substrate on both sides of said gate electrode, wherein said buried insulating film and said second semiconductor layer continuously extend throughout the first and second regions.

19. The semiconductor device of claim 18, wherein said impurity regions are n-type regions.

20. A semiconductor device, comprising:
    a substrate having a recess region;
    a gate electrode formed on said substrate at a lower portion of said recess region; and
    impurity regions formed in surfaces of said substrate on both sides of said gate electrode, wherein said substrate includes a first semiconductor layer, a buried insulating film under the first semiconductor layer, and a second semiconductor layer under the buried insulating film, and wherein the impurity regions are in the first semiconductor layer and in contact with the buried insulating layer.

21. The semiconductor device of claim 20, wherein said impurity regions are p-type regions.

22. The semiconductor device of claim 20, further comprising a gate device of claim insulating film, wherein said gate insulation film is formed in said first semiconductor layer on the buried insulating film.

23. The semiconductor device of claim 20, further comprising a field insulating film formed in the substrate, wherein the field insulating film separates said substrate into a first region and a second region, and wherein the field insulating film extends through the first semiconductor layer to be in contact with the buried insulating film, wherein said buried insulating film and said second semiconductor layer continuously extend throughout the first and second regions.

* * * * *